(12) United States Patent
Chen et al.

(10) Patent No.: US 6,903,574 B2
(45) Date of Patent: Jun. 7, 2005

(54) MEMORY ACCESS VIA SERIAL MEMORY INTERFACE

(75) Inventors: Zheng (Jeff) Chen, Macungie, PA (US); Fulong Zhang, Willow Grove, PA (US); Harold Scholz, Allentown, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 35 days.

(21) Appl. No.: 10/629,512

(22) Filed: Jul. 29, 2003

(65) Prior Publication Data

US 2005/0024085 A1 Feb. 3, 2005

(51) Int. Cl.$^7$ ............................................. H03K 19/177
(52) U.S. Cl. ........................................... 326/41; 326/40
(58) Field of Search ................................ 326/37–41, 47

(56) References Cited

U.S. PATENT DOCUMENTS

| | | | | |
|---|---|---|---|---|
| RE37,195 E | * | 5/2001 | Kean | 326/39 |
| 6,255,848 B1 | * | 7/2001 | Schultz et al. | 326/41 |
| 6,483,342 B2 | | 11/2002 | Britton et al. | |
| 6,675,306 B1 | * | 1/2004 | Baxter | 713/400 |

* cited by examiner

*Primary Examiner*—James H. Cho
(74) *Attorney, Agent, or Firm*—MacPherson Kwok Chen & Heid LLP; Greg J. Michelson

(57) ABSTRACT

Systems and methods are disclosed herein to provide access to memory cells within a programmable logic device. For example, in accordance with an embodiment of the present invention, a serial memory interface is associated with each special functional block within a programmable logic device to provide access to configuration memory cells of the special functional block.

16 Claims, 5 Drawing Sheets

MEMORY ACCESS VIA SERIAL MEMORY INTERFACE

TECHNICAL FIELD

The present invention relates generally to electrical circuits and, more particularly, to memory within an integrated circuit, such as a programmable logic device.

BACKGROUND

Programmable logic devices are increasingly being incorporated as part of a system design and employed for a broad range of applications. Consequently, special functional blocks (SFBs) are often embedded into the programmable logic device (PLD) to meet the desired requirements (e.g., high speed interface requirements). For example, a SFB may include a phase-locked loop (PLL) or a delay-locked loop (DLL) along with high-speed input/output (I/O) circuits and memory interface controllers to help support the application requirements (e.g., system-on-a-chip requirements).

SFBs typically have some programmable options controlled by configuration memory cells within the programmable logic device. Often most of these programmable options may be determined during the design phase and set via the configuration bitstream, with no further changes required after the initial configuration. However, some of the programmable options may require dynamic adjustments or fine tuning (e.g., field adjustments while on the circuit board) after the initial configuration has been completed to find the best setting for a specific device and environment. For example, the duty cycle option of a PLL within a PLD may be fixed in design and on board, but the voltage-controlled oscillator (VCO) tap options guarding the frequency may have to be adjusted through trial and error for each specific device containing the PLD due to slight performance differences between devices.

One technique for providing dynamic adjustments is to perform partial reconfiguration. For example, the default settings for the SFB's programmable options are initially downloaded into the PLD (e.g., a field programmable gate array (FPGA), a complex programmable logic device (CPLD), or a programmable interconnect device). If one or more of the default settings are not correct, the default settings may be changed via a partial reconfiguration bitstream while the PLD retains its remaining configuration settings and may remain in a user-defined operating mode. One drawback of this technique is the complexity associated with partial reconfiguration control and the inefficiency of downloading a partial reconfiguration bitstream for the relatively few bits required for an SFB adjustment.

Another technique is to embed a system bus into a PLD and hardwire every SFB onto the system bus so that the configuration memory cells of each SFB are utilized as system bus registers. Each SFB can then be independently reconfigured by data transfers via the embedded system bus while avoiding bitstream downloading associated with partial reconfiguration techniques. Further details regarding an exemplary system bus may be found in U.S. Pat. No. 6,483,342, which is incorporated herein by reference in its entirety.

One drawback of the system bus technique is the layout difficulty often encountered to hardwire the system bus to all of the SFBs within the PLD (e.g., due to the extensive dedicated routing and buffering). Furthermore, if a user only requires access to the configuration memory cells associated with one of the SFBs, the entire system bus must be enabled. Additionally, the fixed bus address associated with each SFB's register may also limit software placement of an SFB for a user's desired application. As a result, there is a need for improved techniques for accessing memory within a PLD.

SUMMARY

Systems and methods are disclosed herein to provide access (e.g., writing and possibly reading capability) to memory within a programmable logic device. For example, in accordance with an embodiment of the present invention, a serial memory interface is associated with each special functional block within a programmable logic device. The serial memory interface provides access to local configuration memory cells associated with the corresponding special functional block.

More specifically, in accordance with one embodiment of the present invention, a programmable logic device includes a system bus; a plurality of configuration memory cells; and a memory interface, coupled to at least one of the configuration memory cells and couplable to the system bus via a programmable interconnect, adapted to provide access to the at least one configuration memory cell after configuration of the programmable logic device to write data carried by the system bus to the at least one configuration memory cell.

In accordance with another embodiment of the present invention, a programmable logic device includes a system bus; a programmable interconnect; means for storing configuration data; and means for interfacing with the storing means after configuration has completed to change the configuration data stored by the storing means with data carried by the system bus, wherein the interfacing means is couplable to the system bus via the programmable interconnect.

In accordance with another embodiment of the present invention, a method of modifying configuration data stored within a programmable logic device after configuration has been completed includes providing memory interfaces for a plurality of configuration memory cells which store at least a portion of the configuration data; providing a system bus for carrying data to be written to at least some of the plurality of the configuration memory cells; and providing a programmable interconnect adapted to couple the system bus to the memory interface to route the data from the system bus to the memory interface.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
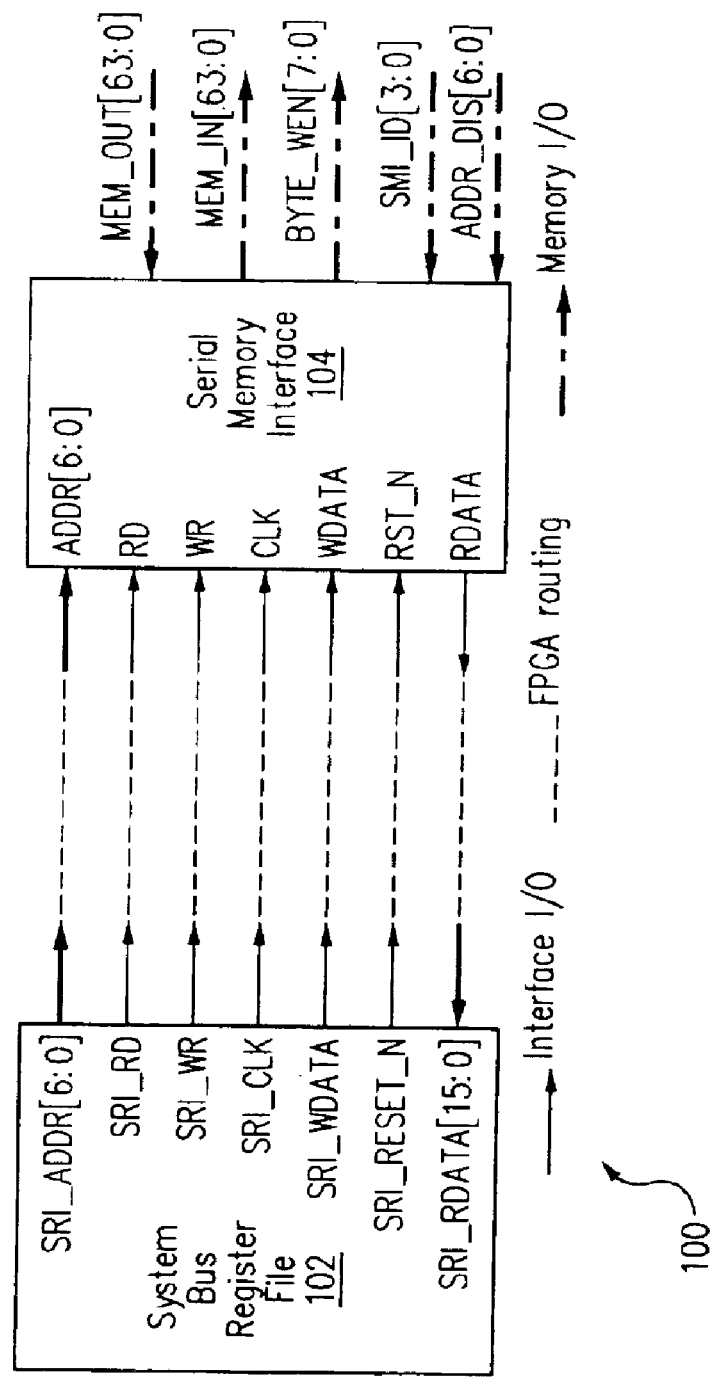
FIG. 1 shows a block diagram illustrating a memory interface in accordance with an embodiment of the present invention.

FIG. 1 shows a block diagram illustrating a memory interface 100 in accordance with an embodiment of the present invention. Memory interface 100 is incorporated into an integrated circuit, such as a programmable logic device, to provide access to configuration memory cells.

Memory interface 100 includes a system bus register file 102 and a serial memory interface 104. System bus register file 102 represents an interface to a system bus that communicates data to be written to (or possibly read from) memory cells (not shown) via one or more associated serial memory interfaces 104.

In this exemplary implementation illustrated in FIG. 1, only one serial memory interface 104 is shown, but system bus register file 102 may communicate with up to sixteen serial memory interfaces 104. Each serial memory interface 104 may communicate with up to 64 memory cells, for example, in byte increments. It should be understood, however, that numerous modifications and variations are possible in accordance with the principles of the present invention.

Each serial memory interface 104 may communicate with system bus register file 102 (or other type of control logic as discussed further below, such as in reference to FIG. 2) via the programmable logic device's routing fabric or programmable interconnect architecture (e.g., labeled as FPGA routing in FIG. 1). The interface signals for serial memory interface 104 may include an address (ADDR[6:0]) signal, a read (RD) signal, a write (WR) signal, a clock (CLK) signal, a write data (WDATA) signal, a reset (RST_N) signal, and a read data (RDATA) signal.

The address signal is a multiple-bit address bus (e.g., 7 bits). The address signal bus width may depend on the maximum number of serial memory interfaces 104 within the programmable logic device (or communicating with system bus register file 102) and the maximum number of memory cells that each serial memory interface 104 may need to dynamically adjust (e.g., after configuration has been completed).

For example, to address 64 memory cells (e.g., configuration memory cells, such as a static random access memory cell, a flip-flop, a fuse, and/or an antifuse) via each serial memory interface 104, three bits are required from the address signal (if each address represents a byte). If there are 16 serial memory interfaces 104 that can be addressed by system bus register file 102, then four more bits are required from the address signal. Consequently, the bus width of the address signal equals seven bits for this example.

As an example, the upper four bits (i.e., ADDR[6:3]) of the address signal determine which serial memory interface 104 is being selected (or enabled). The remaining three bits (i.e., ADDR[2:0]) of the address signal determine which byte of the eight bytes of memory accessible by the selected serial memory interface 104 is being addressed.

The read (RD) signal and the write (WR) signal provide a read enable and a write enable, respectively, to serial memory interface 104. For example, each assertion of the read signal (e.g., read strobe) or the write signal (e.g., write strobe) initiates the transfer of a byte of data.

The write data (WDATA) signal and the read data (RDATA) signal provide in a serial (or alternatively a parallel) fashion the data to be written to or read from, respectively, the memory cells via serial memory interface 104. In the exemplary implementation shown in FIG. 1 with system bus register file 102 possibly communicating with up to 16 of serial memory interfaces 104, a data (SRI_RDATA [15:0]) signal of system bus register file 102 provides 16 lines to receive data from up to 16 corresponding serial memory interfaces 104 via their read data (RDATA) signal.

The clock (CLK) signal and the reset (RST_N) signal provide a clock signal and a reset signal, respectively, to serial memory interface 104. The clock signal, for example, may be a system clock of the programmable logic device or a divided-down version of the system clock. The reset signal, for example, may be generated from an active low bus reset signal of the programmable logic device.

Serial memory interface 104 communicates with the memory cells (e.g., local configuration memory cells, flip-flops, or fuses) through various memory input/output signals (e.g., via hardwired signal paths and labeled memory I/O in FIG. 1). The signals may include a MEM_OUT[63:0] signal, a MEM_IN[63:0] signal, a BYTE_WEN[7:0] signal, a SMI_ID[3:0] signal, and an ADDR_DIS[6:0] signal. The MEM_OUT[63:0] signal and the MEM_IN [63:0] signal allow up to 64 bits of data to be read from and written to, respectively, the memory cells (e.g., 64 memory cells) by serial memory interface 104. For example, the bits of data may be written or read as 8 individual bytes of data.

The BYTE_WEN[7:0] signal is a byte write-enable signal whose bits are asserted in a mutually-exclusive fashion to write one of eight bytes of data into the memory cells at one time. The ADDR_DIS[6:0] signal may be used to disable any bit of the address (ADDR[6:01] signal. The ADDR_DIS[6:0] signal may be provided by configuration memory cells to allow a user to programmably disable one or more of the address bits. For example, a user may choose not to utilize all of the address bits or not access all of the bytes that could be stored in the memory cells that are accessible via serial memory interface 104.

The SMI_ID[3:0] signal provides an identification number for serial memory interface 104. The SMI_ID[3:0] signal may be programmable by employing configuration memory cells (e.g., SRAM cells, fuses, or antifuses) so that, for example, each special functional block (SFB) may be configured to utilize any one of the sixteen serial memory interfaces 104 (e.g., each having access to eight bytes of memory). Thus, each serial memory interface 104 may be programmably associated with a SFB.

The programmable identification number, provided by the SMI_ID[3:0] signal, may be matched with the upper bits of the address (ADDR[6:0]) signal (based on the above example) to determine whether a particular serial memory interface 104 is being addressed (i.e., match the upper four bits (i.e., ADDR[6:3]) of the address signal with the bits of the SMI_ID[3:0] signal). The programmable identification number may be set by a user through the PLD's design software to associate a given serial memory interface 104 with a SFB. Consequently, the user is free to map the configuration memory of any SFB into any bus register address reserved for SFBs. Furthermore, not only can the configuration memory cells of one of the SFBs be independently accessed via the associated serial memory interface 104, but the configuration memory cells of multiple SFBs may be accessed at the same time via their associated serial memory interfaces 104 if these serial memory interfaces 104 have the same identification number.

As discussed herein in accordance with an embodiment of the present invention, memory interface 100 utilizes serial memory interface 104 (e.g., a generic serial memory interface within each special functional block), rather than a hardwired conventional system bus, to communicate with various memory (e.g., configuration memory cells of the special functional block). For example, serial memory interface 104 may be viewed as providing an instant memory access interface to memory cells of a special functional block for on-board dynamic adjustment in contrast to the conventional partial reconfiguration techniques. Serial memory interface 104 may also be viewed as a generic functional block that may be employed to support memory access requirements for any circuitry within a programmable logic device, such as for example for field programmable system-on-a-chip application.

Serial memory interface 104 may utilize a serial data interface, as illustrated in FIG. 1, because throughput is generally not a concern for dynamic access to configuration memory. However, a parallel data interface may also be implemented, in accordance with an embodiment of the present invention, if required or desired for an intended application.

As discussed in reference to FIG. 1, system bus register file 102 interfaces with serial memory interface 104. However, system bus register file 102 (and the system bus) may be substituted with any user-defined logic as long as the logic follows the handshaking protocol for read/write operations via serial memory interface 104.

Figure 2:
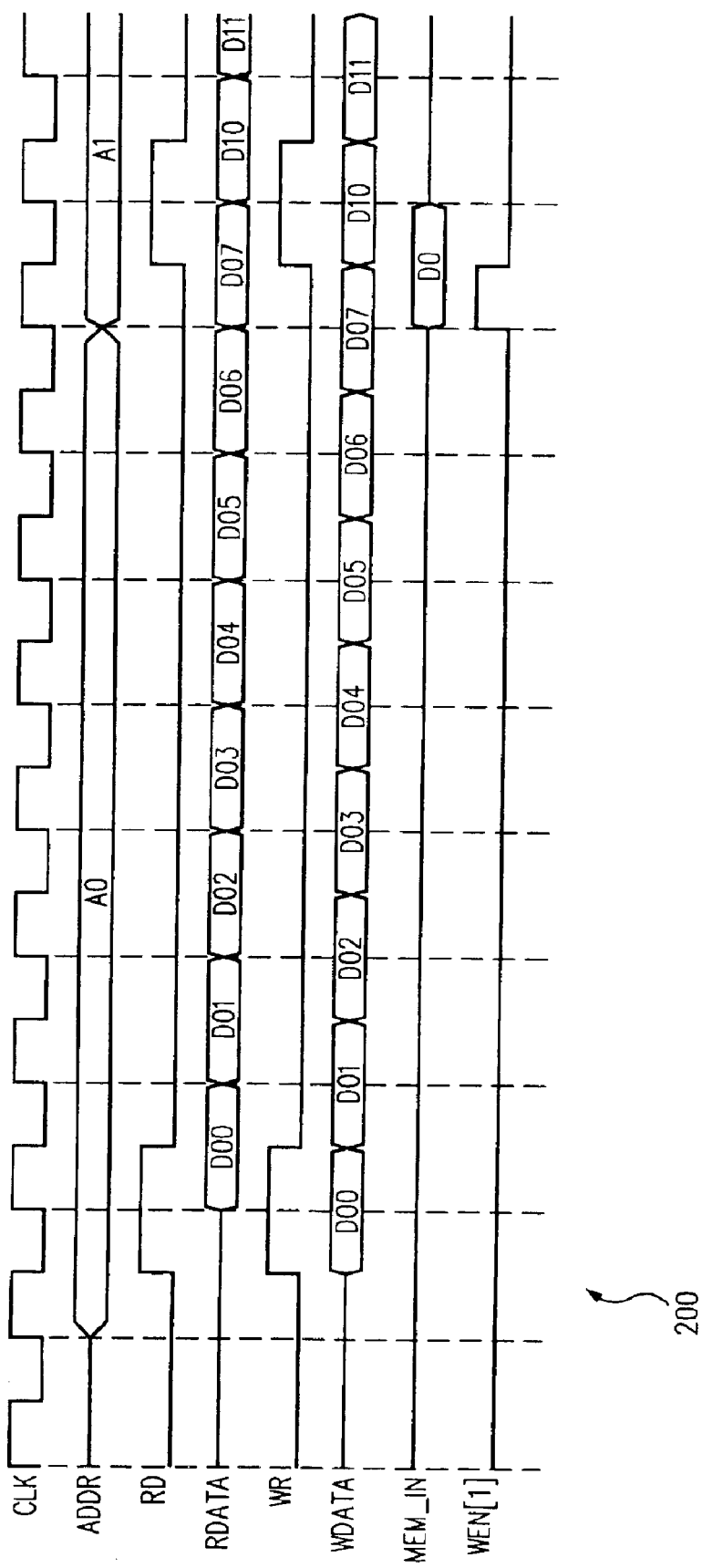
FIG. 2 shows an exemplary timing diagram for a serial memory interface in accordance with an embodiment of the present invention.

For example, FIG. 2 shows an exemplary timing diagram for serial memory interface 104 in accordance with an embodiment of the present invention. The waveforms CLK, ADDR, RD, RDATA, WR, WDATA, MEM_IN, and WEN [i] of FIG. 2 correspond with the clock (CLK) signal, the address (ADDR[6:0]) signal, the read (RD) signal, the read data (RDATA) signal, the write (WR) signal, the write data (WDATA) signal, the MEM_IN[63:0] signal, and the BYTE_WEN[7:0] signal of serial memory interface 104.

It should be noted for the protocol example shown in FIG. 2 that the RD waveform and the WR waveform actually cannot be asserted at the same time. To provide a zero hold time for the input signals to serial memory interface 104, the WR waveform, the RD waveform, and the WDATA waveform may be synchronized with the falling edge of the CLK waveform.

In general, the byte-lane WEN[i] of the BYTE_WEN [7:0] signal may be only active for half of a clock cycle. Also, the frequency of the CLK waveform may be determined by the write access time of the memory cells (e.g., the configuration memory cells being accessed).

Techniques discussed herein may provide certain advantages over conventional techniques. For example, no layout effort is needed to hardwire all of the serial memory interfaces 104 (and associated special functional blocks) onto a system bus, because the PLD's design software can easily place and route serial memory interfaces 104 to the system bus via the generic PLD routing fabric or architecture. Also, serial memory interface 104 may be accessed by user-defined logic, due to its generic nature, without requiring an embedded system bus as long as the user's logic complies with the handshaking protocol of serial memory interface 104. Furthermore, the interface may be shared by multiple closely located serial memory interfaces 104 (within closely located corresponding SFBs) to save PLD routing resources.

Figure 3:
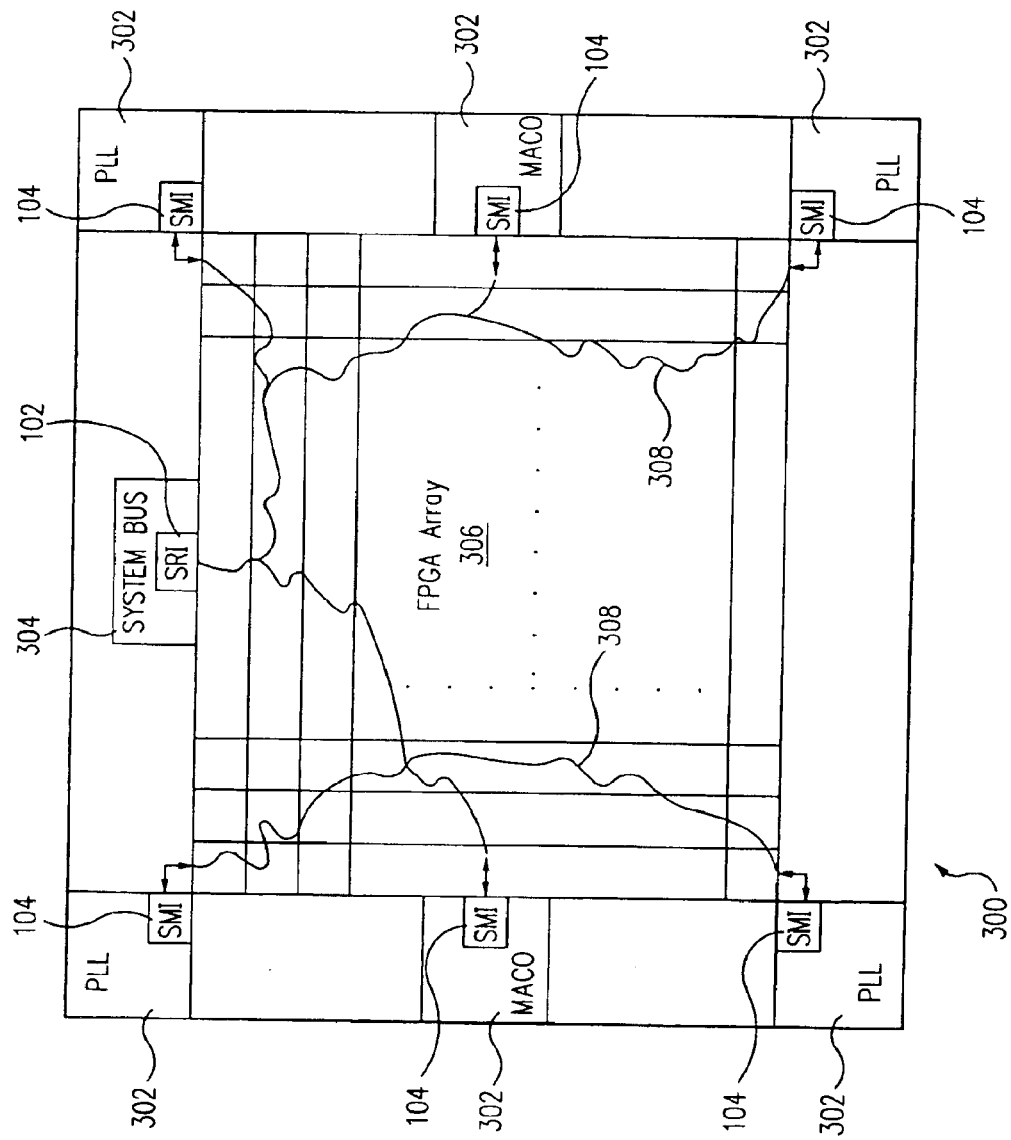
FIG. 3 shows a block diagram of a programmable logic device in accordance with an embodiment of the present invention.

FIG. 3 shows a block diagram of a programmable logic device 300 in accordance with an embodiment of the present invention. Programmable logic device 300 includes a number of special functional blocks 302, a system bus 304, and a core logic 306. Core logic 306 may represent any type of logic utilized by a programmable logic device, such as an array of logic gates or lookup tables (e.g., FPGA logic array).

Special functional blocks 302 may represent any type of circuit, such as for example a PLL or a circuit selected from a cell library (e.g., a metal-programmable standard cell library and labeled MACO in FIG. 3). Special functional blocks 302 are each associated with a serial memory interface (SMI) 104 that provides access to one or more configuration memory cells controlling corresponding special functional blocks 302. A number of interconnect lines 308 are shown that provide a programmable interconnect between serial memory interfaces 104 and system bus register file 102, which provides access to system bus 304.

Figure 4:
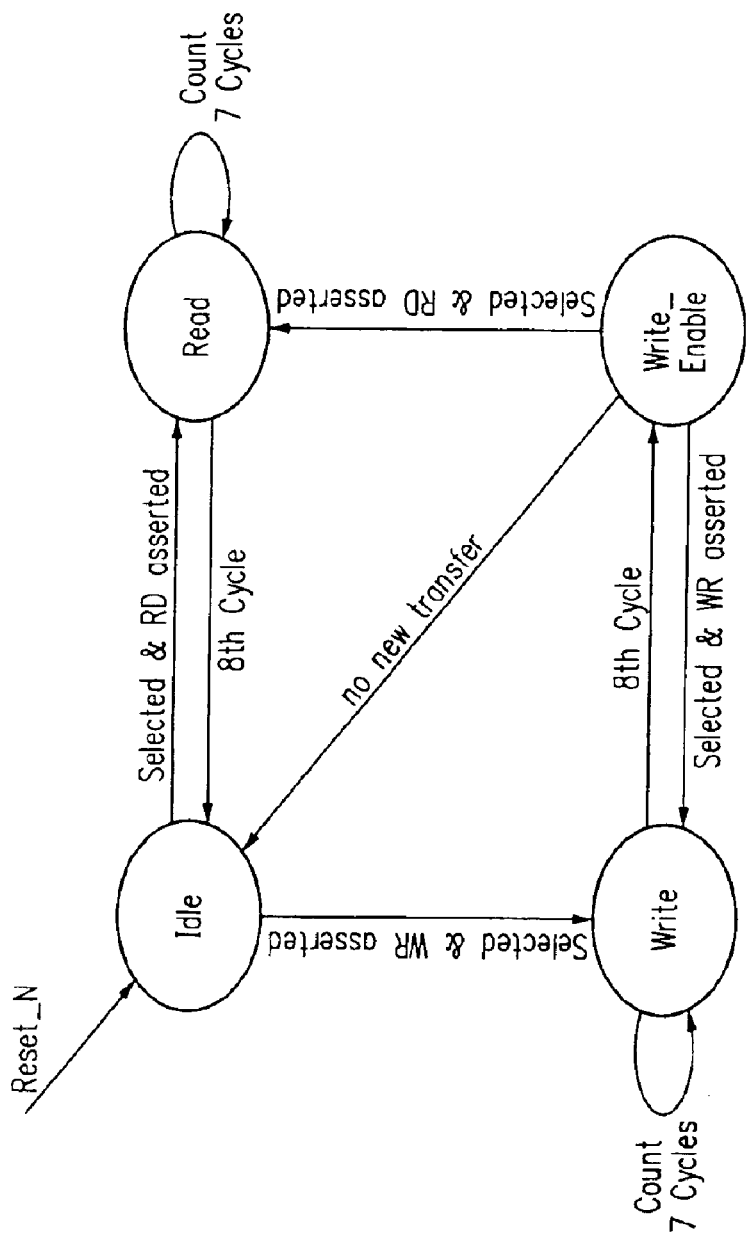
FIG. 4 shows an exemplary finite state machine for a serial memory interface in accordance with an embodiment of the present invention.

FIG. 4 shows an exemplary finite state machine diagram for a serial memory interface in accordance with an embodiment of the present invention. The finite state machine illustrates the read and write states, such as for example when the read enable signal or the write enable signal is asserted and the serial memory interface is being addressed (e.g., the address signal matches the identification or address of the serial memory interface and indicated by the term "selected" in FIG. 4).

Figure 5:
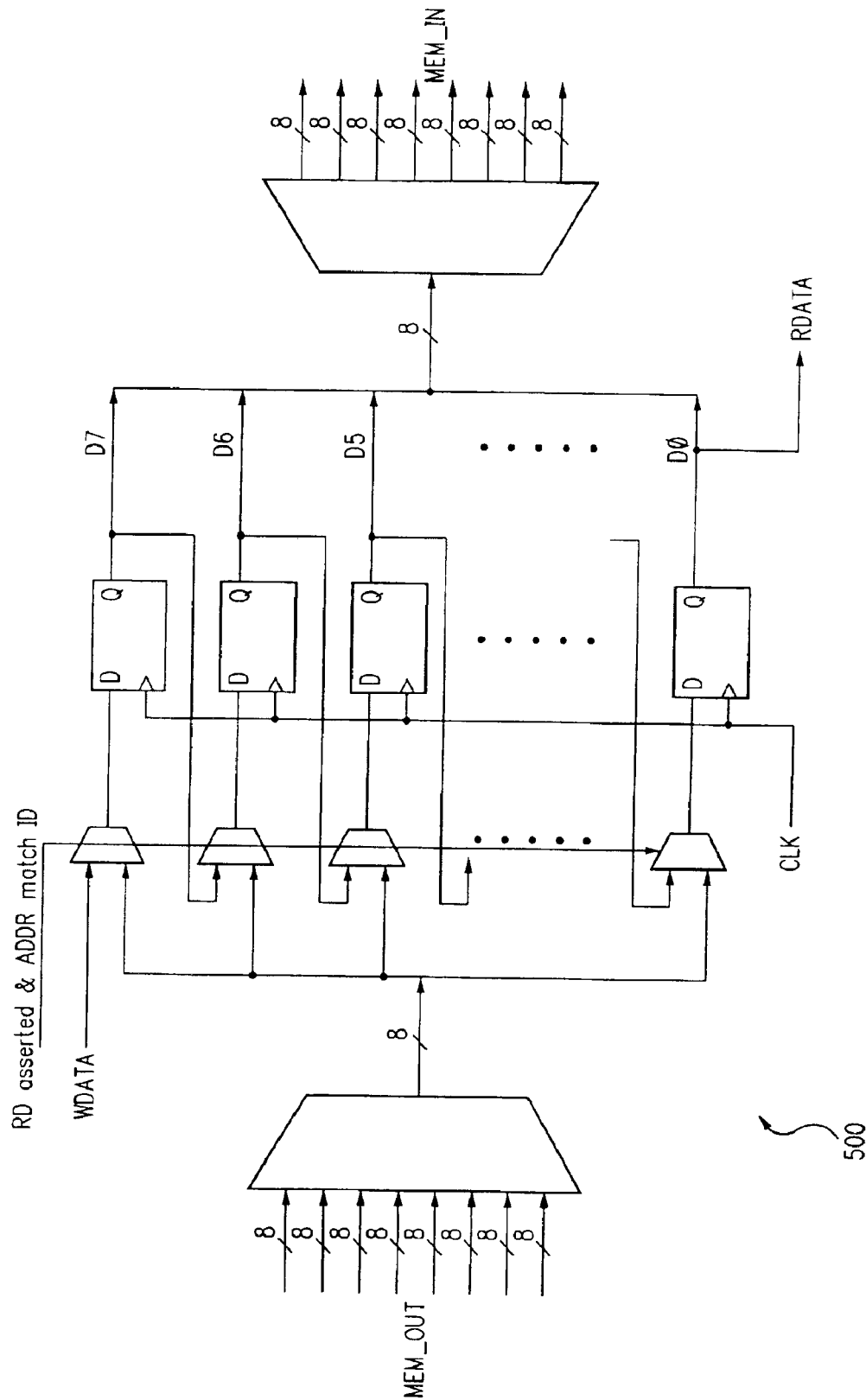
FIG. 5 shows an exemplary circuit diagram for a portion of a serial memory interface in accordance with an embodiment of the present invention.

FIG. 5 shows an exemplary circuit 500 for a portion of serial memory interface 100 in accordance with an embodiment of the present invention. Circuit 500 functions as a byte-to-bit shift register during a read operation and as a bit-to-byte shift register during a write operation.

For example, the data to be written is received via a serial WDATA lead and shifted to the memory cells as a byte via one of the MEM-IN leads. The data to be read from the memory cells is received via one of the MEM-OUT leads as a byte and shifted out as serial bits via a RDATA lead.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   a system bus;
   a plurality of configuration memory cells;
   a memory interface, coupled to at least one of the configuration memory cells and couplable to the system bus via a programmable interconnect, adapted to provide access to the at least one configuration memory cell after configuration of the programmable logic device to write data carried by the system bus to the at least one configuration memory cell; and
   wherein a programmable identification number is associated with the memory interface and is set via one or more of the configuration memory cells.

2. The programmable logic device of claim 1, further comprising a system bus register file coupled to the system bus and couplable to the programmable interconnect, adapted to provide an interface between the memory interface and the system bus.

3. The programmable logic device of claim 2, wherein the system bus register file is adapted to communicate with a plurality of the memory interfaces.

4. The programmable logic device of claim 1, wherein the at least one configuration memory cell is associated with a special functional block within the programmable logic device.

5. The programmable logic device of claim 4, wherein the special functional block comprises a phase-locked loop circuit, a delay locked loop circuit, an input/output circuit, and/or a memory interface controller.

6. The programmable logic device of claim 1, wherein the configuration memory cells comprise static random access memory cells and/or flip flops.

7. The programmable logic device of claim 1, wherein the memory interface communicates with the at least one configuration memory cell in byte increments.

8. The programmable logic device of claim 1, further comprising at least one additional memory interface, wherein the memory interfaces may have the same programmable identification number.

9. A programmable logic device comprising:
   a system bus;
   a programmable interconnect;
   means for storing configuration data;
   means for interfacing with the storing means after configuration has completed to change the configuration data stored by the storing means with data carried by the system bus, wherein the interfacing means is couplable to the system bus via the programmable interconnect; and
   a system bus register file adapted to couple to the programmable interconnect and interface the system bus to the interface means.

10. The programmable logic device of claim 9, wherein the interfacing means is addressed via one or more programmable identification numbers.

11. The programmable logic device of claim 9, wherein the storing means comprises static random access memory cells.

12. The programmable logic device of claim 9, wherein the storing means is associated with a special functional block.

13. A method of modifying configuration data stored within a programmable logic device after configuration has been completed, the method comprising:
   providing memory interfaces for a plurality of configuration memory cells which store at least a portion of the configuration data;
   providing a system bus for carrying data to be written to at least some of the plurality of the configuration memory cells;
   providing a programmable interconnect adapted to couple the system bus to the memory interface to route the data from the system bus to the memory interface; and
   providing a system bus register file to interface the system bus to each of the memory interfaces via the programmable interconnect.

14. The method of claim 13, wherein each of the memory interfaces is addressed via an associated programmable identification number.

15. The method of claim 14, wherein the programmable identification number may be the same for one or more of the memory interfaces.

16. The method of claim 13, wherein the plurality of the configuration memory cells are associated with special functional blocks.

* * * * *